(12) United States Patent
Shimomura et al.

(10) Patent No.: US 6,865,703 B2
(45) Date of Patent: Mar. 8, 2005

(54) SCAN TEST SYSTEM FOR SEMICONDUCTOR DEVICE

(75) Inventors: Takehiko Shimomura, Tokyo (JP); Masayuki Konishi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 542 days.

(21) Appl. No.: 09/939,602

(22) Filed: Aug. 28, 2001

(65) Prior Publication Data

US 2002/0144200 A1 Oct. 3, 2002

(30) Foreign Application Priority Data

Mar. 27, 2001 (JP) ........................................ 2001-090830

(51) Int. Cl.[7] .............................................. G01R 31/28
(52) U.S. Cl. ...................... 714/726; 714/727; 714/724; 714/733; 702/120; 326/16; 377/19
(58) Field of Search ............................... 714/726, 727, 714/724, 733, 734; 702/120; 326/16; 377/19; 365/201

(56) References Cited

U.S. PATENT DOCUMENTS 5,404,358 A * 4/1995 Russell ....................... 714/727
5,428,624 A * 6/1995 Blair et al. .................. 714/727
5,491,666 A * 2/1996 Sturges ........................ 365/201
6,708,304 B1 * 3/2004 Tsukimori et al. .......... 714/726

FOREIGN PATENT DOCUMENTS

| JP | 5-322989 | 12/1993 |
|---|---|---|
| JP | 07-104039 | 4/1995 |
| JP | 11-038091 | 2/1999 |

* cited by examiner

*Primary Examiner*—Albert DeCady
*Assistant Examiner*—Dipakkumar Gandhi
(74) *Attorney, Agent, or Firm*—Burns, Doane, Swecker & Mathis, L.L.P.

(57) ABSTRACT

There is provided a scan test system comprising: a semiconductor device including a scan register connected between an input/output pin on an analog input side and an internal system logic; a semiconductor device including a scan register connected between an input/output pin on an analog output side and an analog sensor; and an analog wiring connecting the input/output pins each other. Thus, the scan register can be chained to thereby constitute a boundary scan register chain, and thereby JTAG control can be carried out by use of TAPC. Therefore, monitoring inspection where probes are set up by high-density-assembling of semiconductor devices and the multiple pins of low-cost devices, can be achieved.

6 Claims, 4 Drawing Sheets

SCAN TEST SYSTEM FOR SEMICONDUCTOR DEVICE

BACKGROUND OF THE INVENTION

1. Field of the Invention

The present invention relates to a scan test system for a semiconductor device, for inspecting the short/open of a wiring connected between semiconductor devices.

2. Description of the Prior Art

FIG. 5 is a schematic constitution diagram of a conventional scan test system for a semiconductor device shown, for instance, in JP-A-05/322989 (1993). The semiconductor device of the system comprises a JTAG boundary scan register that can inspect the short/open of a wiring between the devices digital-connected. FIG. 5 shows a semiconductor device 2, a digital input/output pin 6, an internal system logic 8, a JTAG specification boundary scan register or JTAG boundary scan register 9, a boundary scan register chain 10, TDO (Test Data Output) 11, TMS (Test Mode Select) 12, TDI (Test Data Input) 13, TCK (Test Clock) 14, and a TAPC (Test Access Port Controller) 15.

FIG. 6 illustrates a basic constitution of the boundary scan register 9. FIG. 6 shows an input multiplexer 16, a shift register stage 17, a parallel output stage 18, data input 19, Shift-DR (shift data register signal) 20, Clock-DR (clock data register signal) 21, Update-DR (update data register signal) 22, and data output 23.

The operation of the conventional scan test system for a semiconductor device will next be described.

The built-in boundary scan register 9 of each digital input/output pin 6 performs the basic operations of capture (Capture), shift (Shift), and update (Update) depending on the state transition of the TAPC 15. This state transition of the TAPC 15 is done by an input to TMS, and the TAPC 15 gives a control signal necessary for the operation in each state.

These basic operations will next be described.

(1) Capture Operation

A value from a system circuit, that is, an internal system logic and an external system logic (herein, corresponding to the input from an analog sensor) is captured into the shift register stage 17 of the boundary scan register 9.

(2) Shift Operation

The scan operation of a test data register is done. When the boundary scan register 9 is being specified by the present instruction, this test data register is connected between TDI 13 and TDO 11, and a shift to the serial output direction is thereby caused by one bit synchronizing with TCK 14.

(3) Update Operation the parallel output stage 18 of the test data register is updated. When boundary scan register 9 is being specified by the present instruction, the data is transmitted from the shift register stage 17 of the boundary scan register 9 to the parallel output stage 18 synchronizing with TCK14. By the way, it is when Shift-DR 20 or Capture-DR becomes active that Clock-DR 21 becomes active.

The conventional scan test system for a semiconductor device is constituted as mentioned above. Therefore, because the conventional JTAG boundary scan register 9 is configured with a digital terminal, although it can detect the short/open of an wiring connected between digital-connected devices, it needs monitoring the wiring by additionally contacting the probes thereon in order to detect the short/open of an analog-connected wiring. However, there arises a problem that, with a recent trend of increase in the degree of integration of semiconductor devices, monitoring inspection by setting up probes has become more difficult.

Moreover, there arises a problem that, with a recent progress of increase in the pin number of semiconductor devices, the cost of monitoring inspection by setting up probes has become higher.

Herein, the reason why the conventional JTAG boundary scan register 9 shown in FIG. 5 cannot be connected to an analog terminal will be described. Since the built-in JTAG boundary scan register 9 of the semiconductor device 2 is constituted by a digital circuit, when the analog signal of a middle potential is input (for instance, 2.5 V at the digital input terminal of 5 V-interface), there arises a possibility that the increase of power consumption or a breakdown is caused because of the flow of a through current through the transistor in an input stage. Therefore, the JTAG boundary scan register 9 cannot be connected to the analog terminal.

SUMMARY OF THE INVENTION

The present invention has been accomplished to solve the above-mentioned problem, and is directed to a scan test system for a semiconductor device, by which in a semiconductor-mounted board obtained by mounting semiconductor devices thereon, the short/open of a wiring analog-connected between the devices can be inspected without probe-inspection.

First, the present invention provides a scan test system for a semiconductor device, comprising; a first semiconductor device comprising; a first analog input/output pin existing on the analog input side thereof; a first internal circuit; and a scan register connected therebetween; a second semiconductor device comprising; a second analog input/output pin on the analog input side thereof; a second internal circuit; and a scan register connected therebetween; and an analog wiring connecting the first analog input/output pin and the second analog input/output pin.

Herein, at least one of the first and the second semiconductor devices may constitute a register chain that serially connects a plurality of the scan registers within the device.

In addition, the scan register constituting the register chain may comply with the JTAG specification, and constitute a JTAG scan register, and the test system may comprise control means for controlling this JTAG scan register.

Second, the present invention provides a scan test system for a semiconductor device, comprising; a semiconductor device comprising; a digital/analog pin existing on the input side; a first scan register; an internal circuit; a second scan register; and a digital input/output pin existing on the output side, the first scan register being connected between the digital/analog double-functional pin and the internal circuit, and the second scan register being connected between the digital input/output pin and the internal circuit; a first register chain serially connecting a plurality of the first scan registers, each fetching the data input and outputting the result to the output side; a second register being connected to the first register chain and simultaneously serially connecting a plurality of the second scan registers, each fetching the data input and outputting the result to the output side; and switching means bypassing at least one of the first and the second register chains and thereby connecting the data input to the output side.

Herein, the scan register constituting the first and the second register chains may comply with the JTAG specification, and constitute a JTAG scan register, and the test system may comprise control means for controlling this JTAG scan register.

In addition, the switching means may comprise a first switch, a first bypass line that bypasses the first register chain, a second switch and a second bypass line that bypasses the second register chain, the first switch switching between the first register chain and the first bypass line, and the second switch switching between the second register chain and the second bypass line.

DETAILED DESCRIPTION OF THE PREFERRED EMBODIMENTS

An embodiment of the present invention will be described below.

Embodiment 1.

Figure 1:
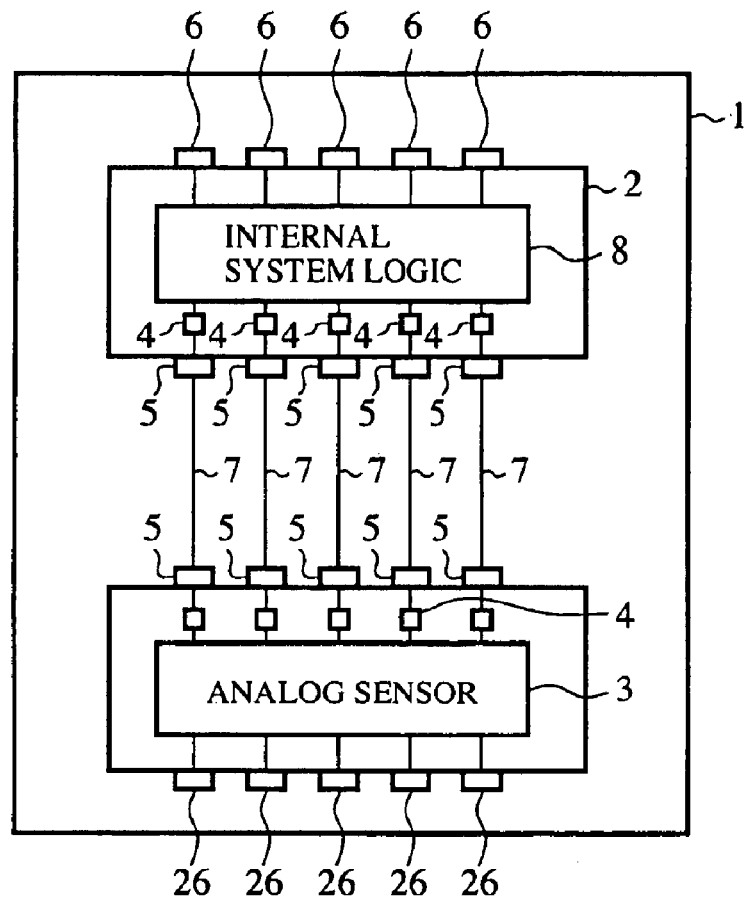
FIG. 1 is a schematic constitution diagram of the scan test system for a semiconductor device according to Embodiment 1 of the present invention.

FIG. 1 is the schematic constitution diagram showing the scan test system for a semiconductor device according to embodiment 1 of the present invention. FIG. 1 shows a semiconductor mounted board 1 such as printed circuit board, a semiconductor device 2 (first semiconductor device), an analog sensor 3 (second internal circuit, second semiconductor device), a scan register 4, an analog input/output pin 5, a digital input/output pin 6, an analog wiring 7, input/output pin 26 and an internal system logic 8 (first internal circuit).

By the way, the semiconductor mounted board 1 is widely used in all fields including general household electrical appliances, and an example of the analog sensor 3 include an acceleration sensor, an accelerator opening sensor, and a vehicle height sensor in the field of application for automobiles. These parts are usually constituted by a semiconductor device.

FIG. 1 shows the example of assembling the semiconductor device 2 and another semiconductor device containing the analog sensor 3. However, a plurality of components are usually densely assembled on the board 1. Thus, in Embodiment 1, it is intended that the analog wiring 7 is inspected in a digital mode by having the scan register 4 for each of the semiconductor device 2 and analog sensor 3 as a means of inspecting a complex wiring.

Figure 2:
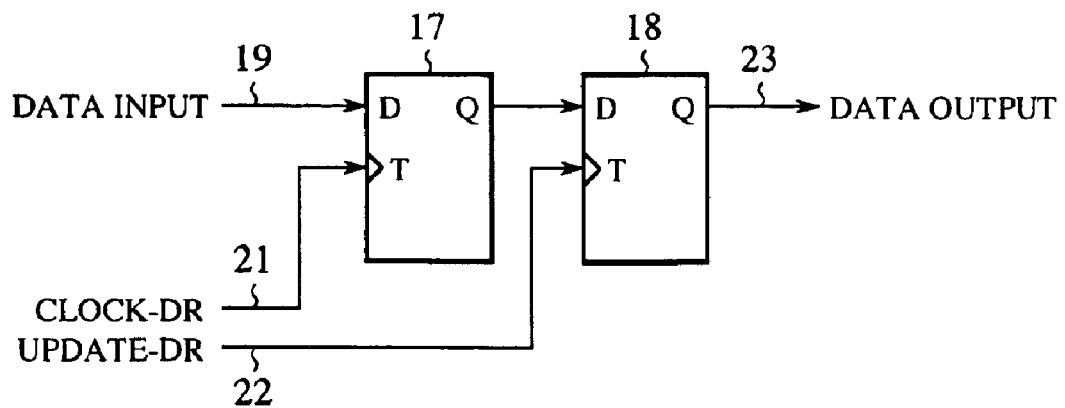
FIG. 2 is a circuit diagram showing the basic constitution of the scan register.

FIG. 2 shows the basic constitution of the scan register 4. FIG. 2 shows a shift register stage 17, a parallel output stage 18, data input 19, Clock-DR (clock data register signal) 21, Update-DR (update data register signal) 22, and data output 23.

The operation of the scan test system for a semiconductor device according to Embodiment 1 will next be described.

A digital signal ("H" or "L") is output by the scan register 4 on the side of analog sensor 3 from the analog input/output pin 5 to the semiconductor device 2. On the other hand, on the side of the semiconductor device 2, the scan register 4 takes the input digital signal ("H" or "L") from the analog input/output pin 5 via the analog wiring 7, and judges whether or not analog the wiring 7 is correctly connected. As a means to operate the scan register 4, for instance, in the analog sensor 3 on the output side, external-pin setting detects the input level of a terminal for test, and makes the analog input/output pin 5 to output the digital signal ("H" or "L"). On the other hand, the scan register 4 on the input side is also made to take the data via a built-in CPU, and to output the data from another pin.

As mentioned above, according to Embodiment 1, only data setting in the scan register 4 can inspect in a digital mode the short/open of the analog wiring 7 analog-connected between the semiconductor device 2 and analog sensor 3, and additionally thereby monitoring inspection such as contacting probes on each wiring which was conventionally done after assembling devices is not required. Therefore, the decrease in the inspection time and at the same time the decrease in the inspection cost can be realized. As a result, the effect that the inspection efficiency improves is achieved.

Embodiment 2.

Figure 3:
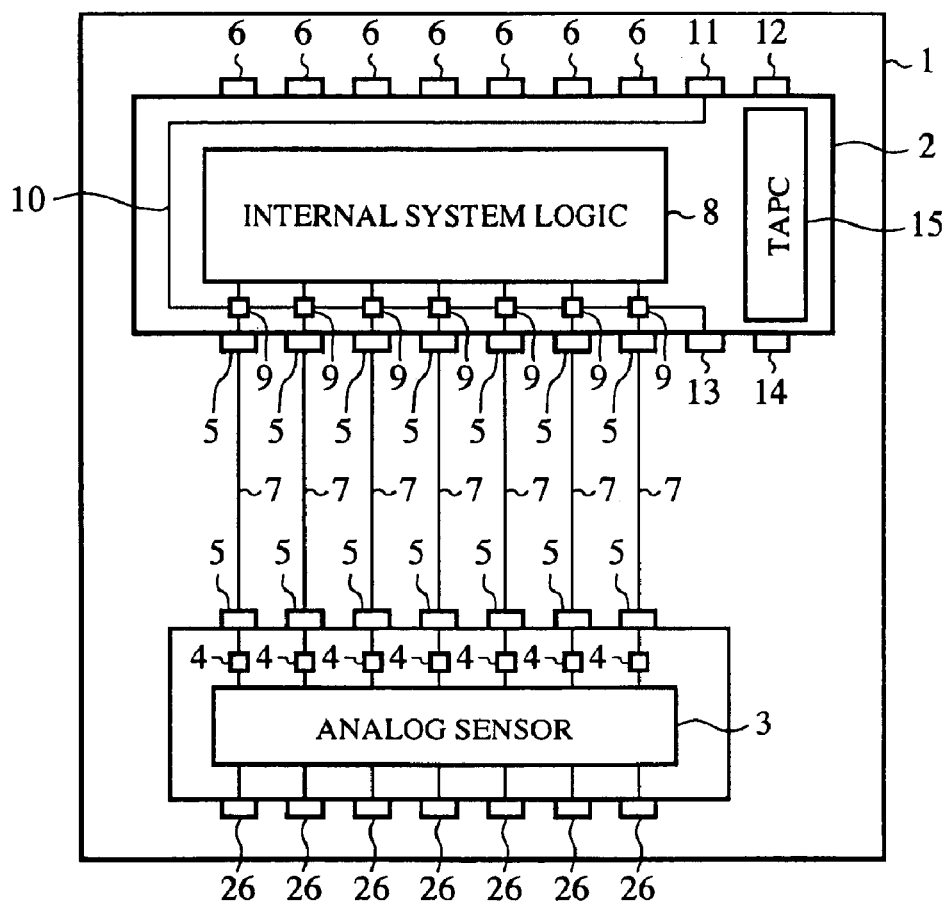
FIG. 3 is a schematic constitution diagram of the scan test system for a semiconductor device according to Embodiment 2 of the present invention.
Figure 5:
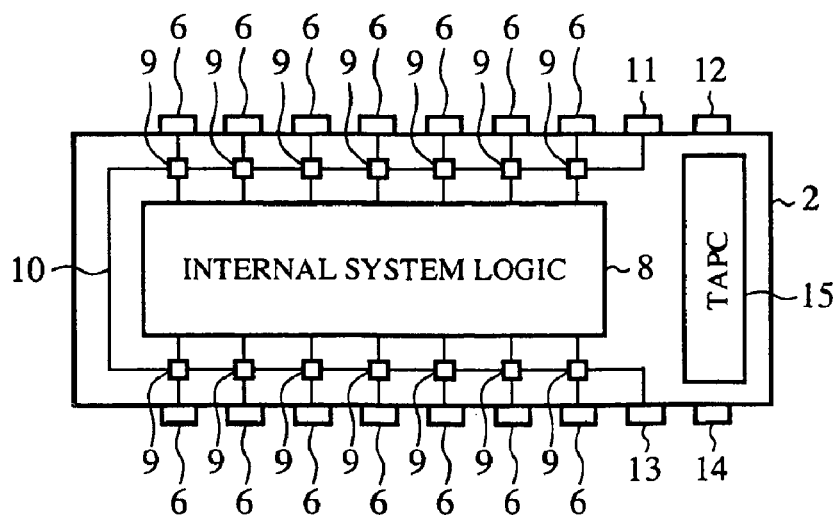
FIG. 5 is a schematic constitution diagram of a conventional scan test system for a semiconductor device.

FIG. 3 is the schematic constitution diagram showing the scan test system for a semiconductor device according to Embodiment 2 of the present invention. FIG. 3 shows a semiconductor mounted board 1, a semiconductor device 2 (the first semiconductor device), an analog sensor 3 (the second semiconductor device), a scan register 4, an analog input/output pin 5, digital input/output pin 6, an analog wiring 7, an internal system logic 8 (the first internal circuit), a boundary scan register 9 (scan register), a boundary scan register chain 10 (register chain), TDO 11 (test data output pin), TMS 12 (test-mode-selecting pin), TDI 13 (test data input pin), TCK 14 (test clock pin), a TAPC 15 (test access port controller) (controlling means), and input/output pin 26.

A supplementary explanation about these components will next be given. TCK 14 is a test clock input, i.e., a clock input that is a dedicated test logic that is common to each component, and that can operate a serial data path spreading across the components, differing from system clocks vary among the components. TMS 12 is a test mode select input. This signal is taken into the test logic on the rising edge of TCK 14, is decoded by TAPC 15, and controls the test operation. TDI 13 is a serial data input. This input value is taken into the instruction register that has been selected or the test data register that has been selected, on the rising edge of TCK 14. TDO 11 is a serial data output. The content of the selected register is output to the outside via this TDO 11 on the rising edge of TCK 14.

FIG. 3 shows the example of connecting semiconductor device 2 and analog sensor 3 as in the Embodiment 1. The boundary scan register 9 complies with JTAG specification, and constitutes the boundary scan register chain 10 by being serially connected. The dedicated TAPC 15 controls this boundary scan register specified by JTAG specification.

When the JTAG instruction is input to the TAPC 15, the instructed TAPC 15 outputs the control signal to each boundary scan register 9 to be executed by a desired operation.

This TAPC 15 transitions to a variety of states (16 states in total) according to the signal changes of TMS 12 and TCK 14. The outline of the transition state will be described hereinafter.

(1) Test-Logic-Reset: The state of resetting.
(2) Run-Test/Idle: The state of performing the test instruction.

(3) Select-DR-Scan: The temporary state for transitioning to other states.

(4) Select-IR-Scan: The temporary state for transitioning to other states.

(5) Capture-IR: The state of taking a fixed value into the shift register stage of the instruction register.

(6) Shift-IR: The stage of performing the scan operation of the instruction register.

(7) Exit 1-IR: The temporary state for transitioning to other states.

(8) Pause-IR: The state of temporarily stopping the shift operation of the instruction register.

(9) Exit 2-IR: The temporary state for transitioning to other states.

(10) Update-IR: The state of renewing the output latch of the instruction register.

(11) Capture-DR: The state of taking a value from the system circuit into the shift register stage of the test data register.

(12) Shift-DR: The stage of performing the scan operation of the test data register.

(13) Exit 1-DR: The temporary state for transitioning to other states.

(14) Pause-DR: The state of temporarily stopping the shift operation of the test data register.

(15) Exit 2-DR: The temporary state for transitioning to other states.

(16) Update-DR: The state of renewing the output latch of the data register.

The operation of the scan test system for a semiconductor device according to Embodiment 2 of the present invention will next be described.

A digital signal ("H" or "L") is output by scan register 4 on the side of the analog sensor 3 from the analog input/output pin 5 to the semiconductor device 2. On the other hand, on the side of the semiconductor device 2, the boundary scan register 9 takes the input digital signal ("H" or "L") and output the result from TDO 11 to the outside along the boundary scan register chain 10. Because this boundary scan register 9 is specified by JTAG specification, the control thereof can be performed by automatically creating the test pattern by use of a commercial boundary scan register inspection apparatus. Inputting the predetermined signals from the outside to TMS 12, TDI 13, and TCK 14 makes TAPC 15 give rise to a state transition, and give a necessary control signal, to thereby operate the system.

As mentioned above, according to Embodiment 2, since the scan test system has a built-in JTAG boundary scan register, and comprises a register chain, in addition to a similar effect to the scan test system for a semiconductor device described in Embodiment 1, the system can use the test pattern automatically created by a commercial boundary scan register inspection apparatus, and thereby produces the effect that the inspection efficiency increases and the inspection cost decreases.

Embodiment 3.

Figure 4A:
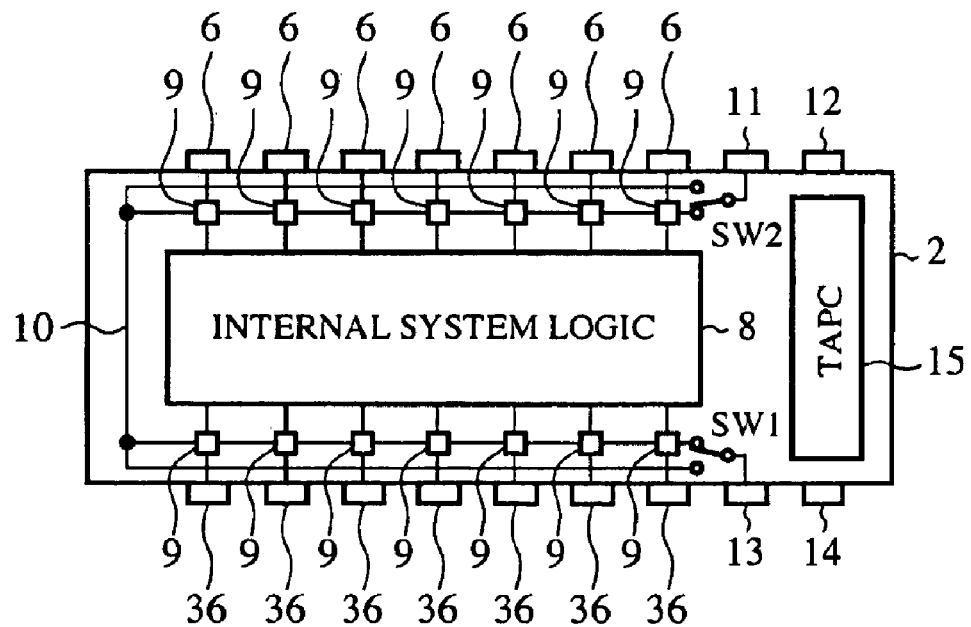
FIGS. 4A and 4B each are a schematic constitution diagram of the scan test system for a semiconductor device according to Embodiment 3 of the present invention.
Figure 4B:
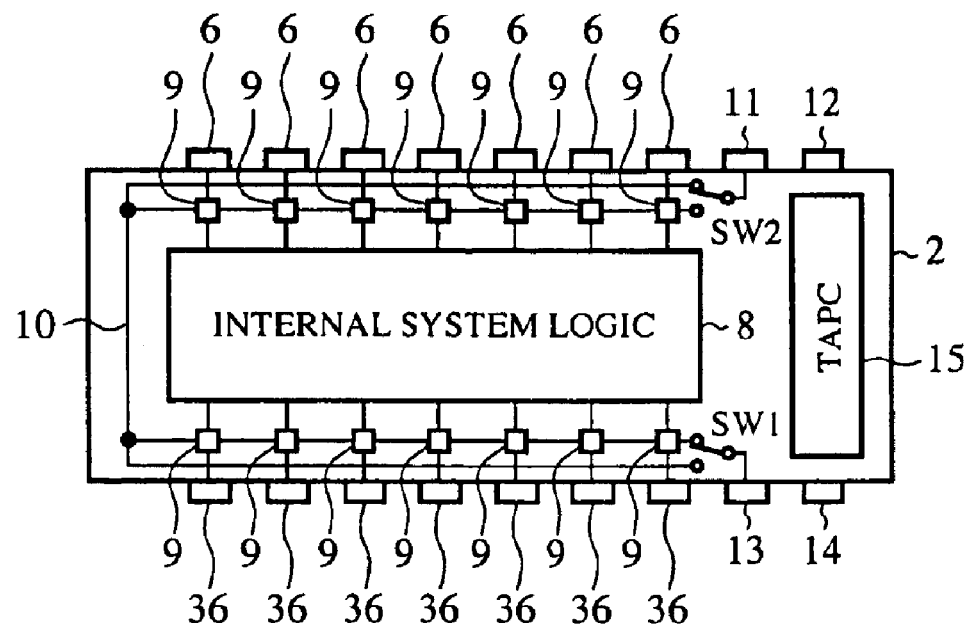
Figure 6:
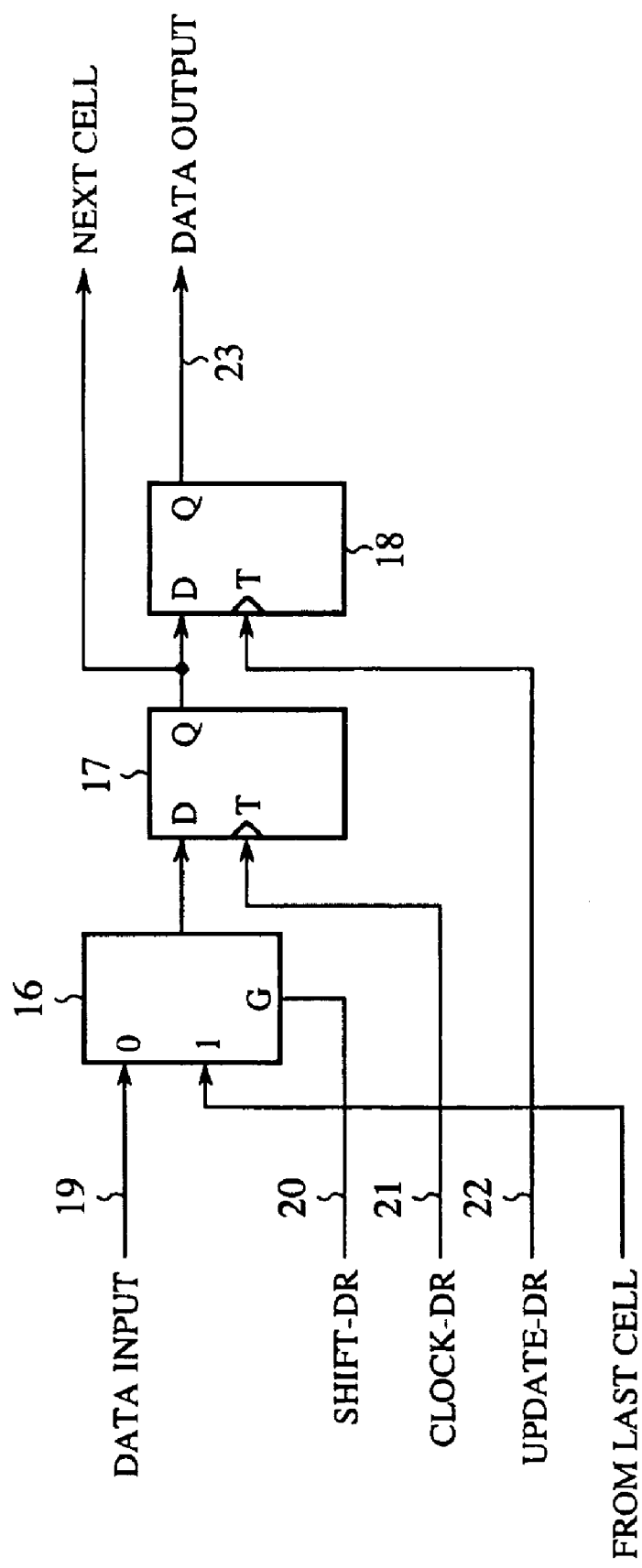
FIG. 6 is a circuit diagram showing the basic constitution of a boundary scan register.

FIG. 4A and FIG. 4B are the schematic constitution diagrams showing the scan test system for a semiconductor device according to Embodiment 3 of the present invention. The examples of installing a boundary scan register to a digital/analog-double-functional pin are shown. Shown in the figure are a semiconductor device 2, a digital input/output pin 6, an internal system logic 8 (internal circuit), a boundary scan register 9 (first and second scan registers), a boundary scan register chain 10 (first and second register chains), TDO 11, TMS 12, TDI 13, TCK 14, TAPC 15, a digital/analog-double-functional pin 36, and switches SW1 and SW2 (switching means, the first switch and the second switch).

Herein, since a commercial boundary scan inspection apparatus corresponds to a digital pin, when the digital/analog-double-functional pin 36 is used as an analog pin, the double-functional pin is used by means of switching the path by use of switches SW1 and SW2. By the way, when the digital/analog-double-functional pin 36 is used as a digital pin, since the double-functional pin is used as the equivalent of a usual digital pin, the path is switched for avoiding a bypass.

FIG. 4A shows a case in which the digital/analog-double-functional pin 36 is used as a digital pin. In this case, since the double-functional pin is used as the equivalent of another dedicated digital pin, serially connecting the pin with the another boundary scan register enables a bulk inspection. On the other hand, FIG. 4B shows a case in which the digital/analog-double-functional pin 36 is used as an analog pin. In this case, the same operation as in Embodiment 2 is performed.

The operation of the scan test system for a semiconductor device according to Embodiment 3 of the present invention will next be described.

The boundary scan register 9 takes the digital signal ("H" or "L") input in the semiconductor device 2, and outputs the result from TDO 11 to the outside along boundary scan register chain 10, to thereby perform the wiring inspection of the analog pin. By the way, the control of boundary scan register 9 is performed, as in the Embodiment 2, by making the TAPC 15 give rise to a state transition, and create a necessary control signal by means of inputting a signal from the outside to TMS 12, TDI 13, and TCK 14.

As mentioned above, according to Embodiment 3, the same effect as that of Embodiment 2 is obtained, and additionally, the following effect is obtained. That is, since an optical scan register will be constituted based on JTAG instructions, when, for instance, a user uses a double-functional pin as a digital pin, the person can use the test pattern created by a commercial automatic test-pattern-creating tool, and carry out the bulk inspection, by constituting a chain by means of using the double-functional pin with another dedicated digital pin. Therefore, the effect that the inspection efficiency further improves is obtained.

As mentioned above, according to the present invention, since a scan test system for a semiconductor device comprises; a first semiconductor device comprising; a first analog input/output pin on the analog input side thereof; a first internal circuit; and a scan register connected therebetween; a second semiconductor device comprising; a second analog input/output pin on the analog input side thereof; a second internal circuit; and a scan register connected therebetween; and an analog wiring connecting the first analog input/output pin and the second analog input/output pin, in order to inspect in digital form the short/open of the wiring analog-connected between the first and the second semiconductor devices, the monitoring inspection such as contacting probes on each wiring which was conventionally done after assembling devices is not required. Therefore, the effect that the decrease in inspection cost can be performed and that the inspection efficiency improves is obtained.

According to the present invention, since at least one of the first and the second semiconductor devices constitutes a register chain that serially connects a plurality of the scan registers within the device, a commercial boundary scan register inspection apparatus can automatically create the test pattern. Therefore, in addition to the above-described effect, the effect that the inspection time and cost can be decreased is obtained.

According to the present invention, since the scan register constituting the register chain complies with the JTAG specification, and constitutes a JTAG scan register, and the test system comprises control means for controlling this JTAG scan register, the system can send the JTAG instruction to the control means, and the control means receiving the instruction outputs the control signal to each scan register, the system being able to perform the desired operation, to thereby automatically inspect the short/open of the wiring. As a result, the effect that the inspection time can be shortened, the extra monitoring inspection such as contacting the probe on each wiring can be eliminated, and the inspection efficiency simultaneously improves, is obtained.

According to the present invention, since a scan test system for a semiconductor device comprises; a semiconductor device comprising; a digital/analog pin existing on the input side; a first scan register; an internal circuit; a second scan register; and a digital input/output pin existing on the output side, the first scan register being connected between the digital/analog pin and the internal circuit, and the second scan register being connected between the digital input/output pin and the internal circuit; a first register chain serially connecting a plurality of the first scan registers, each fetching the data input and outputting the result to the output side; a second register being connected to the first register chain and simultaneously serially connecting a plurality of the second scan registers, each fetching the data input and outputting the result to the output side; and switching means bypassing at least one of the first and the second register chains and thereby connecting the data input to the output side, in addition to the above-described effect, when, for instance, a user uses a double-functional pin as a digital pin, the person can use an automatic test-pattern-creating tool by constituting the first and the second register chains by means of using the double-functional pin with another dedicated digital pin. On the other hand, when the person uses the double-functional pin as the analog pin, the person can constitute a scan register chain of only an analog pin. Therefore, the effect that the inspection can be carried out with efficiency is obtained.

According to the present invention, since the scan register constituting the first and the second register chains complies with the JTAG specification, and constitutes a JTAG scan register, and the test system comprises control means for controlling this JTAG scan register, the system can send the JTAG instruction to the control means, and the control means receiving the instruction outputs the control signal to each scan register, the system being able to perform the desired operation, to thereby automatically inspect the short/open of the wiring. As a result, the effect that the inspection time can be shortened, and additionally, that the inspection cost can decrease since the extra monitoring inspection such as contacting the probe on each wiring can be eliminated, is obtained. The effect that the inspection efficiency improves, is simultaneously obtained.

According to the present invention, since the switching means comprises: a first switch, a first bypass line that bypasses the first register chain, a second switch and a second bypass line that bypasses the second register chain, the first switch switching between the first register chain and the first bypass line, and the second switch switching between the second register chain and the second bypass line, the effect that the appropriate use of the first or the second switches enables the selection of the function, for instance, when the double-functional pin is used as both a digital pin and a analog pin, the use of the first switch can perform the switching, is obtained.

What is claimed is:

1. A scan test system for a semiconductor device, comprising:

a first semiconductor device including a first analog input/output pin existing on the analog input side thereof, a first internal circuit, and a scan register connected between said first input/output pin and said first internal circuit;

a second semiconductor device including a second analog input/output pin on the analog input side thereof, a second internal circuit, and a scan register connected between said second input/output pin and said second internal circuit; and an analog wiring connecting said first analog input/output pin and said second analog input/output pin.

2. The scan test system for a semiconductor device according to claim 1, wherein at least one of the first and second semiconductor devices constitutes a register chain that serially connects a plurality of the scan registers within the device.

3. The scan test system for a semiconductor device according to claim 2, wherein the scan register constituting the register chain complies with the JTAG specification, and constitutes a JTAG scan register, and the test system comprises control means for controlling this JTAG scan register.

4. A scan test system for a semiconductor device, comprising:

said semiconductor device including:

a first scan register connected between a digital/analog double function pin on the input side and an internal circuit;

a second scan register connected between a digital input/output pin and said internal circuit;

a first register chain serially connecting a plurality of said first scan registers, each fetching the data input and outputting the result to the output side;

a second register chain being connected to said first register chain and simultaneously serially connecting a plurality of said second scan registers, each fetching the data input and outputting the result to the output side; and switching means bypassing at least one of said first and the second register chains and thereby connecting the data input to the output side.

5. A scan test system for a semiconductor device according to claim 4, wherein the scan register constituting the first and the second register chains complies with the JTAG specification, and constitutes a JTAG scan register, and the test system comprises control means for controlling this JTAG scan register.

6. A scan test system for a semiconductor device according to claim 4, wherein the switching means comprises: a first switch, a first bypass line that bypasses the first register chain, a second switch and a second bypass line that bypasses the second register chain, the first switch switches between the first register chain and the first bypass line, and the second switch switches between the second register chain and the second bypass line.

* * * * *